(12) United States Patent
Liao et al.

(10) Patent No.: US 12,243,703 B2
(45) Date of Patent: Mar. 4, 2025

(54) PROBE CARD DEVICE AND CIRCUIT PROTECTION ASSEMBLY THEREOF

(71) Applicants: GLOBAL UNICHIP CORPORATION, Hsinchu (TW); TAIWAN SEMICONDUCTOR MANUFACTURING COMPANY, LTD., Hsinchu (TW)

(72) Inventors: Chih-Chieh Liao, Hsinchu (TW); Yu-Min Sun, Hsinchu (TW); Chih-Feng Cheng, Hsinchu (TW)

(73) Assignees: GLOBAL UNICHIP CORPORATION, Hsinchu (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 182 days.

(21) Appl. No.: 17/809,901

(22) Filed: Jun. 30, 2022

(65) Prior Publication Data

US 2023/0360874 A1 Nov. 9, 2023

(30) Foreign Application Priority Data

May 5, 2022 (TW) .................................. 111117021

(51) Int. Cl.
| | |
|---|---|
| *H01H 85/02* | (2006.01) |
| *G01R 1/073* | (2006.01) |
| *G01R 1/36* | (2006.01) |
| *H05K 1/11* | (2006.01) |

(52) U.S. Cl.
CPC ..... *H01H 85/0241* (2013.01); *G01R 1/07342* (2013.01); *G01R 1/36* (2013.01); *H05K 1/112* (2013.01); *H01H 2085/0275* (2013.01)

(58) Field of Classification Search
CPC ....... G01R 1/07342; G01R 1/36; H05K 1/112; H01H 85/0241; H01H 2085/0275
See application file for complete search history.

(56) References Cited

U.S. PATENT DOCUMENTS

| | | | | |
|---|---|---|---|---|
| 5,461,327 | A * | 10/1995 | Shibata | G01R 1/07314 324/750.08 |
| 6,229,329 | B1 * | 5/2001 | Nakata | G01R 31/2886 324/754.07 |
| 2002/0024787 | A1 * | 2/2002 | Anthony | H01C 7/028 361/106 |

(Continued)

*Primary Examiner* — Eman A Alkafawi
*Assistant Examiner* — Suresh K Rajaputra
(74) *Attorney, Agent, or Firm* — CKC & Partners Co., LLC

(57) ABSTRACT

A probe card device includes a wiring board provided with a plurality of contacts, a probe head having a probe holder and a plurality of conductive probes arranged on the probe holder, respectively, and a circuit protection assembly including an insulation plate, a plurality of through holes and a plurality of self-resetting fusing elements. The insulation plate is sandwiched between the wiring board and the probe head. The through holes are respectively formed on the insulation plate and arranged in an array form. The self-resetting fusing elements are respectively disposed within the through holes. Each of the self-resetting fusing elements is electrically connected to one of the contacts and one of the conductive probes for reversibly breaking down electric currents from the wiring board to the conductive probe.

18 Claims, 4 Drawing Sheets

(56) References Cited

U.S. PATENT DOCUMENTS

| | | | |
|---|---|---|---|
| 2003/0025172 A1* | 2/2003 | Grube | G01R 31/2889 |
| | | | 257/459 |
| 2003/0122570 A1* | 7/2003 | Byrd | G01R 1/07371 |
| | | | 324/754.07 |
| 2003/0234659 A1* | 12/2003 | Zieleman | G01R 31/319 |
| | | | 324/762.05 |
| 2006/0215342 A1* | 9/2006 | Montoya | H01C 1/148 |
| | | | 361/103 |
| 2006/0268645 A1* | 11/2006 | Graf | H01H 69/02 |
| | | | 365/225.7 |
| 2019/0019641 A1* | 1/2019 | Signer | H05K 1/0201 |

* cited by examiner

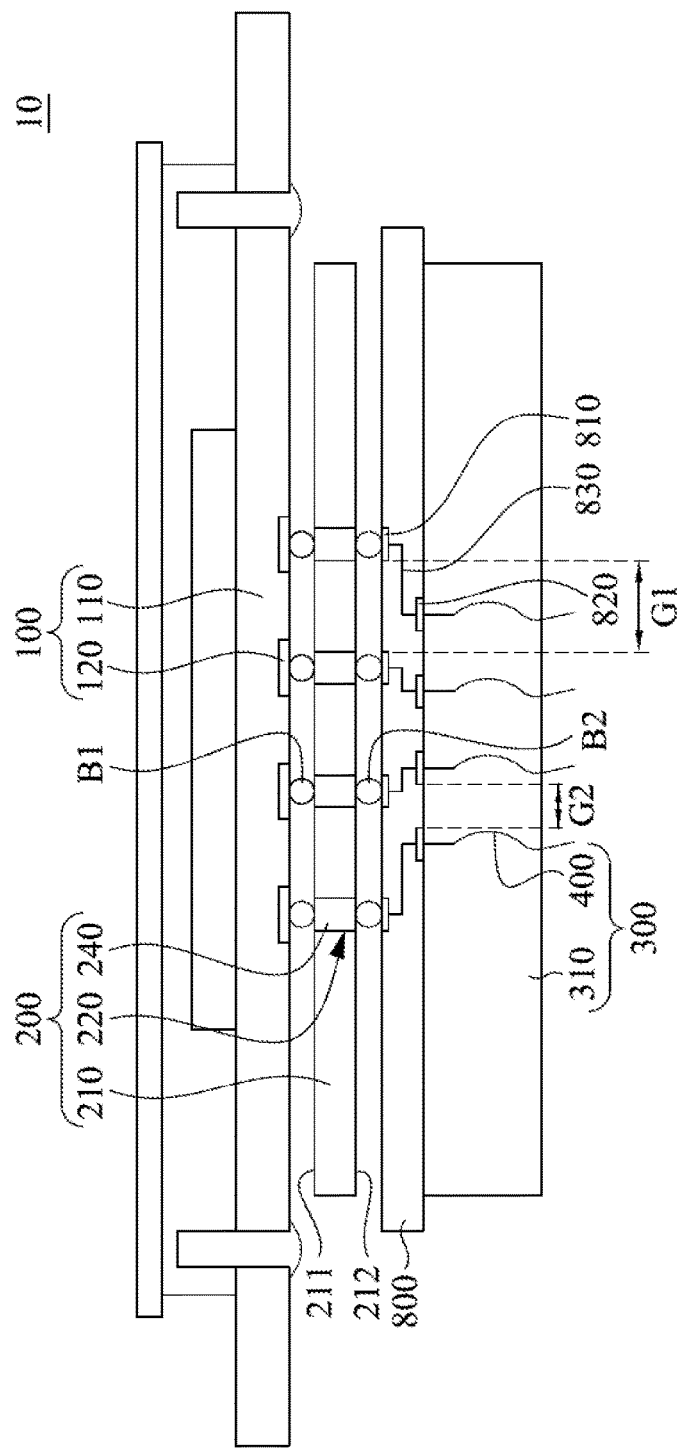
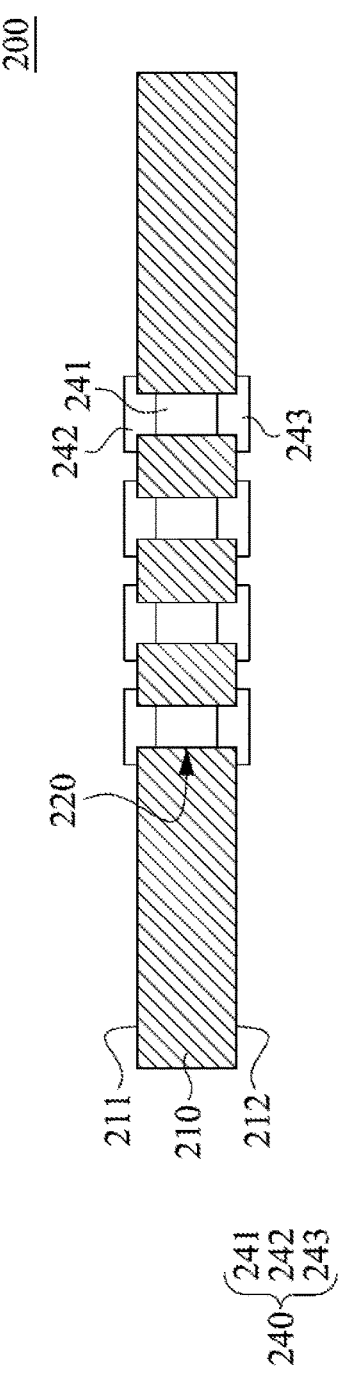
Fig. 1
Fig. 2

PROBE CARD DEVICE AND CIRCUIT PROTECTION ASSEMBLY THEREOF

RELATED APPLICATIONS

This application claims priority to Taiwan Application Serial Number 111117021, filed on May 5, 2022, which is herein incorporated by reference.

BACKGROUND

Field of Disclosure

The present disclosure relates to a probe card device. More particularly, the present disclosure relates to a probe card device with a circuit protection assembly.

Description of Related Art

In general, a semiconductor element, for example a die or a wafer, is moved into a test platform during a Chip Probe (CP) testing stage. Next, probes of the probe card located above the test platform can be controlled to descend for contacting the semiconductor element so as to perform electrical inspection on the semiconductor element.

However, when the electrical inspection is performed on the semiconductor element by the probe card, a small number of probes of the probe card may cause needle burning or needle melting phenomenon due to fault currents so as to cause these specific probes being failure, and unable to continuously perform the corresponding electrical inspection, which not only increases the failure rate and maintenance cost, but also increases the inspection time of semiconductor elements.

It is noted that the above-mentioned technology obviously still has inconvenience and defects, and needs to be further improved. Therefore, how to develop a solution to improve the foregoing deficiencies and inconvenience is an important issue that relevant persons engaged in the industry are currently unable to delay.

SUMMARY

One aspect of the present disclosure is to provide a probe card device and a circuit protection assembly thereof to solve the aforementioned problems of the prior art.

In one embodiment of the present disclosure, a probe card device is provided, and the probe card device includes a wiring board, a probe head and a circuit protection assembly. The wiring board is provided with a plurality of first contacts. The probe head includes a probe holder and a plurality of first conductive probes arranged on the probe holder, respectively. The circuit protection assembly includes an insulation plate, a plurality of first through holes and a plurality of self-resetting fusing elements. The insulation plate is sandwiched between the wiring board and the probe head. The first through holes are respectively formed on the insulation plate, and arranged on the insulation plate in an array form. The self-resetting fusing elements are respectively disposed within the first through holes. Each of the self-resetting fusing elements is electrically connected to one of the first contacts and one of the first conductive probes for reversibly breaking down electric currents from the wiring board to the one of the first conductive probes.

In one embodiment of the present disclosure, a circuit protection assembly of a probe card device is provided, and the circuit protection assembly is suitable to be sandwiched between a wiring board and a probe head of the probe card device, and the circuit protection assembly includes an insulation plate, a plurality of first through holes and a plurality of self-resetting fusing elements. The first through holes are respectively formed on the insulation plate, and arranged on the insulation plate. The self-resetting fusing elements are respectively buried within the first through holes for reversibly breaking down electric currents from the wiring board to one conductive probe, and the self-resetting fusing elements collectively form a pattern array on the insulation plate.

Thus, through the construction of the embodiments above, the present disclosure is able to avoid the needle burning or needle melting phenomenon so as to reduce the possibilities of specific probe failure and improve the continuous electrical inspection.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

FIG. 1 is a schematic view of a probe card device according to one embodiment of the present disclosure.

FIG. 2 is an enlarged cross-sectional view of the circuit protection assembly of FIG. 1.

DESCRIPTION OF THE EMBODIMENTS

Figure 3:
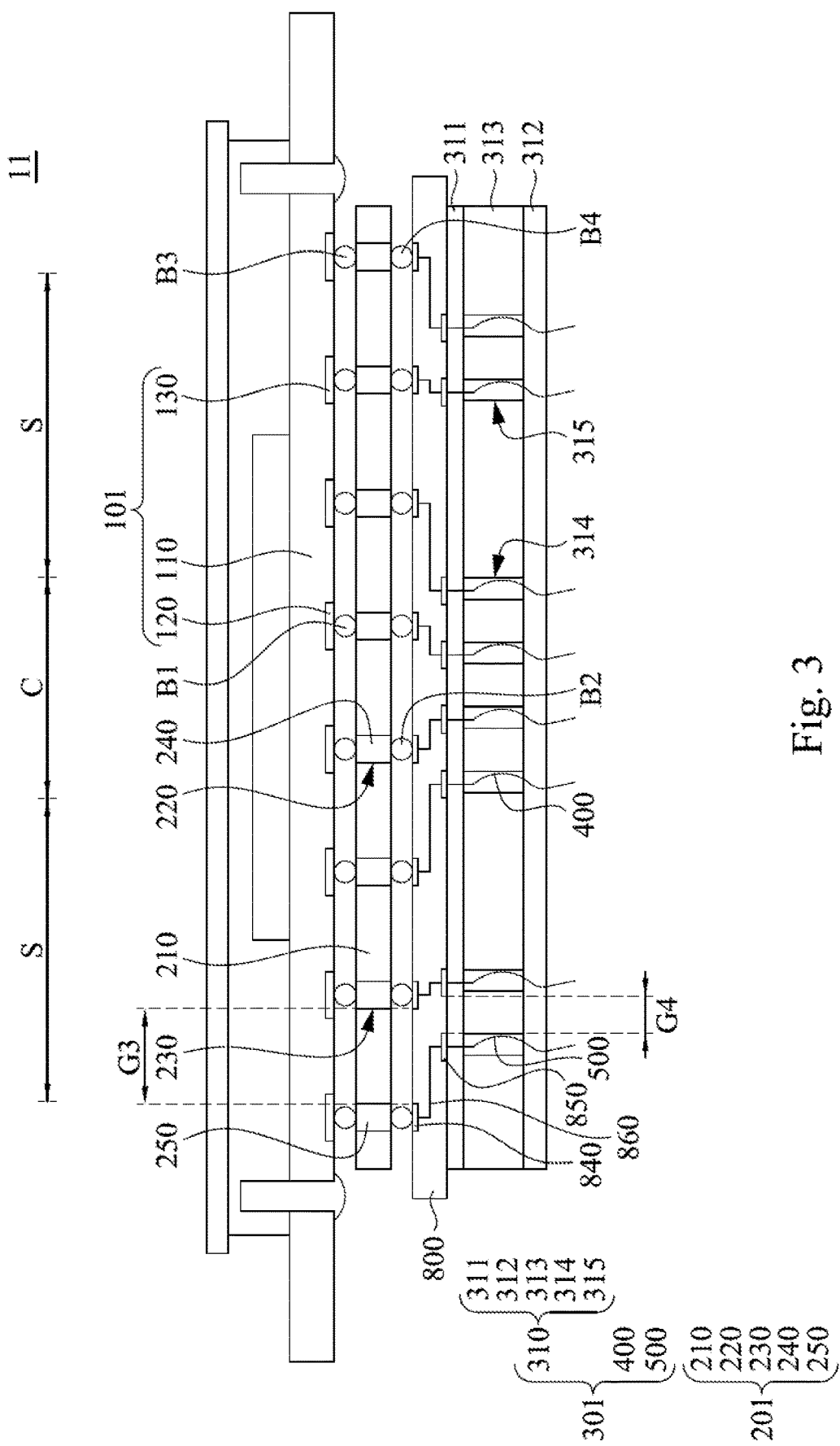
FIG. 3 is a schematic view of a probe card device according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Reference is now made to FIG. 1 to FIG. 2, in which FIG. 1 is a schematic view of a probe card device 10 according to one embodiment of the present disclosure, and FIG. 2 is an enlarged cross-sectional view of the circuit protection assembly 200 of FIG. 1. As shown in FIG. 1 to FIG. 2, the probe card device 10 includes a wiring board 100, a circuit protection assembly 200 and a probe head 300. The wiring board 100 includes a substrate 110 and a plurality of first contacts 120 spaced disposed on one surface of the substrate 110, and arranged on the substrate 110 in an array form. The probe head 300 includes a probe holder 310 and a plurality of first conductive probes 400. The probe holder 310 is disposed on one side of the wiring board 100. The first conductive probes 400 are spaced disposed on the probe holder 310, and arranged on the probe holder 310 in the aforementioned array form. The first conductive probes 400 are used to contact conductive pillars of a device under test (DUT). The circuit protection assembly 200 is disposed between the wiring board 100 and the probe head 300, and the circuit protection assembly 200 includes an insulation plate 210, a plurality of first through holes 220 and a plurality of self-resetting fusing elements 240. The insulation plate 210 is sandwiched between the substrate 110 and the probe holder 310. The first through holes 220 are respectively formed on the insulation plate 210, and arranged on the insulation plate 210 in an array form. The self-resetting fusing elements 240 are buried within the first through holes 220, respectively, in other words, the self-resetting fusing elements 240 collectively form a pattern array on the insulation plate 210. Each of the self-resetting fusing elements 240 is in a power-on state at ambient temperature, so that electric currents are allowed to be transmitted from the wiring board 100 to the probe head 300 through the corresponding self-resetting fusing element 240. Each of the self-resetting fusing elements 240 is electrically connected to one of the first contacts 120 of the wiring board 100 and one of the first conductive probes 400 of the probe head 300. Thus, inspection electric currents from one of the first contacts 120 of the wiring board 100 can be transmitted to one of the first conductive probes 400 through the corresponding self-resetting fusing elements 240 so as to perform the electrical inspection on the DUT.

In this way, when the fault currents transmitted from the wiring board 100 to one of the self-resetting fusing elements 240 of the circuit protection assembly 200, the corresponding self-resetting fusing element 240 instantly cuts off the fault currents from the wiring board 100 to the circuit protection assembly 200 for protecting the first conductive probes 400 from being needle burned or needle melted so as to reduce the possibilities of specific probe failure and improve the continuous electrical inspection.

In the embodiment, the probe card device 10 further includes a connected board (e.g., space transforming layer) 800. The connected board 800 is fixedly connected to one side of the probe head 300, and located between the circuit protection assembly 200 and the probe head 300. The connected board 800 includes a plurality of first conductive pads 810, a plurality of second conductive pads 820 and a plurality of first conductive routes 830. The first conductive pads 810 are respectively arranged on one surface of the connected board 800 facing away from the probe head 300, and each of the first conductive pads 810 is connected to one of the self-resetting fusing elements 240. The second conductive pads 820 are opposite to the first conductive pads 810, and are arranged on the other surface of the connected board 800 facing towards the probe head 300, and each of the second conductive pads 820 is connected to one of the first conductive probes 400. The first conductive routes 830 are separably arranged in the connected board 800. Each of the first conductive routes 830 is electrically connected to one of the first conductive pads 810 and one of the second conductive pads 820. A gap G1 between any two neighboring ones of the first conductive pads 810 is greater than a gap G2 between any two neighboring ones of the second conductive pads 820. For example, the probe card device 10 is a vertical probe card, the insulation plate 210 is a ceramic substrate with strong mechanical properties and low warpage, and these first conductive probes 400 respectively are cobra probe.

Thus, when the fault currents heat one of the self-resetting fusing elements 240 to rise the temperature thereof to a critical value, the corresponding self-resetting fusing element 240 is switched from the power-on state into a power-off state, so as to instantly cut off the electric currents transmitted from the wiring board 100 to the circuit protection assembly 200. More specifically, in this embodiment, the critical value is between 150° C. and 200° C.

More specifically, as shown in FIG. 2, the insulation plate 210 is provided with a first surface 211 and a second surface 212 which are opposite to each other. The first surface 211 of the insulation plate 210 is faced towards the wiring board 100, and the second surface 212 of the insulation plate 210 is faced towards the probe head 300. Each of the first through holes 220 penetrates through the insulation plate 210 to collectively connect the first surface 211 and the second surface 212. Each of the self-resetting fusing elements 240 includes a resettable fuse portion 241, a first solder pad 242 and a second solder pad 243. The resettable fuse portion 241 is buried within one of the first through holes 220. One part of the first solder pad 242 is disposed in the corresponding first through hole 220, and another part of the first solder pad 242 is disposed on the first surface 211 of the insulation plate 210. The first solder pad 242 is electrically connected to the corresponding first contact 120, and one end of the corresponding resettable fuse portion 241. The first solder pad 242 is soldered to the corresponding first contact 120 through a solder ball B1, for example. One part of the second solder pad 243 is disposed in the corresponding first through hole 220, and another part of the second solder pad 243 is disposed on the second surface 212 of the insulation plate 210. The second solder pad 243 is electrically connected to one of the first conductive probes 400 and the other end of the corresponding resettable fuse portion 241. The second solder pad 243 is electrically connected to one of the second conductive pad 820 of the connected board 800 via the corresponding first conductive pad 810 and the corresponding first conductive routes 830, so as to electrically connect to the corresponding first conductive probe 400. More specifically, the second solder pad 243 is soldered to the corresponding first conductive pads 810 through a solder ball B2, for example. The resettable fuse portion 241 is only located in the corresponding one of the first through holes 220, and is directly and tightly sandwiched between the corresponding first solder pad 242 and the corresponding second solder pad 243. In other words, the first solder pad 242, the resettable fuse portion 241 and the second solder pad 243 of each of the self-resetting fusing elements 240 are fully filled within the corresponding one of first through holes 220.

Specifically, each of the resettable fuse portions 241 is polymeric positive temperature coefficient (PPTC) body. PPTC body is made of a mixture of semi-crystalline polymers and conductive particles to maintain low resistance at ambient temperatures. In this way, when the peak current exceeds the critical value, the internal crystal melts and gets structurally changed, causing the resistance to rise to million ohms suddenly, thereby breaking down the conduction path of the resettable fuse portion. On the contrary, when the PPTC body is cooled and the temperature of the PPTC body returns to the ambient temperature, the PPTC body is recrystallized again, thereby allowing the conductive particles to open the conductive path again.

It is noted, compared with disposable fuse consumable material, the resettable fuse portions 241 of this embodiment can be reused for a long time, and the normal working resistance of the resettable fuse portions 241 can be either as low as 10 milliohms, and either reach mega-Ohms when it withstands peak current to avoid probe damage. However, the disclosure is not limited thereto, and in other embodiments, the resettable fuse portions 241 may also be ceramics positive temperature coefficient (CPTC) body, respectively.

Figure 4:
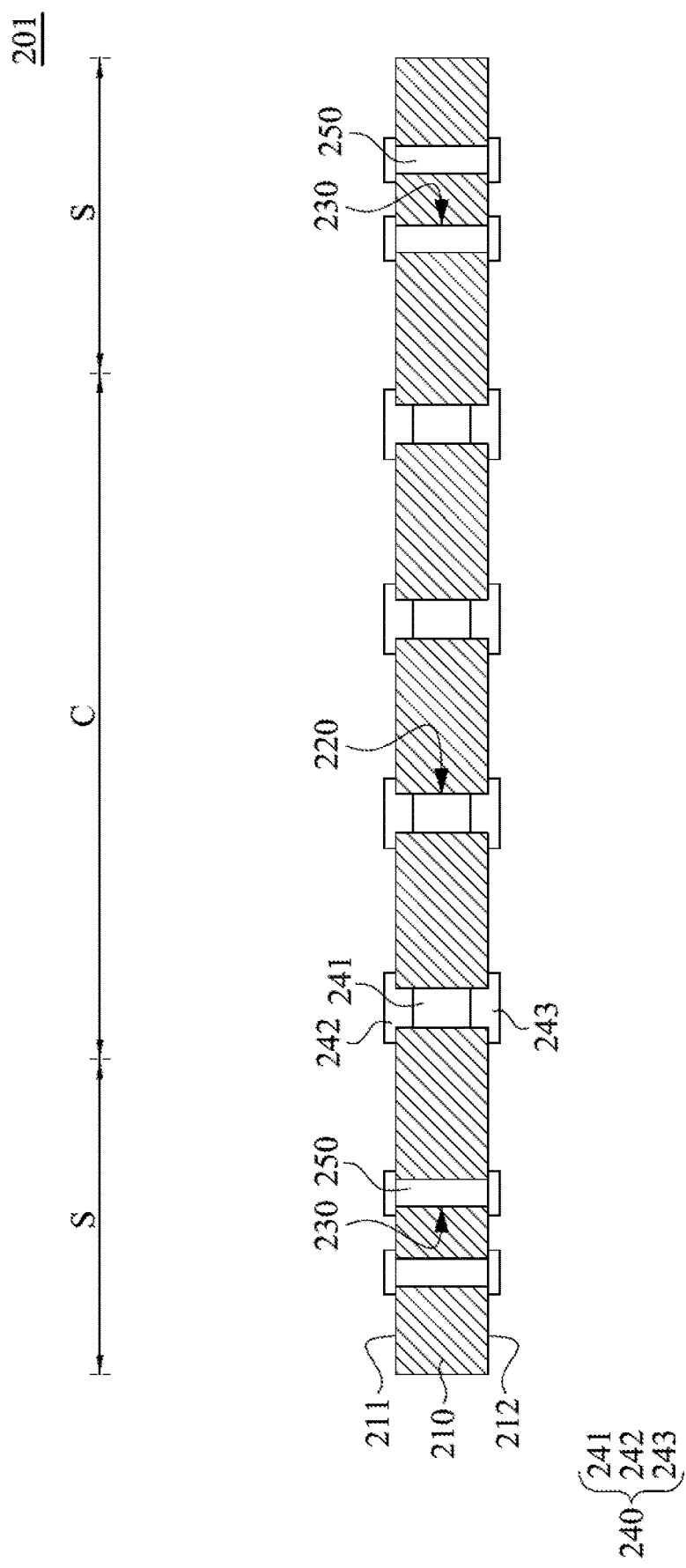
FIG. 4 is an enlarged cross-sectional view of the circuit protection assembly of FIG. 3.
Figure 5:
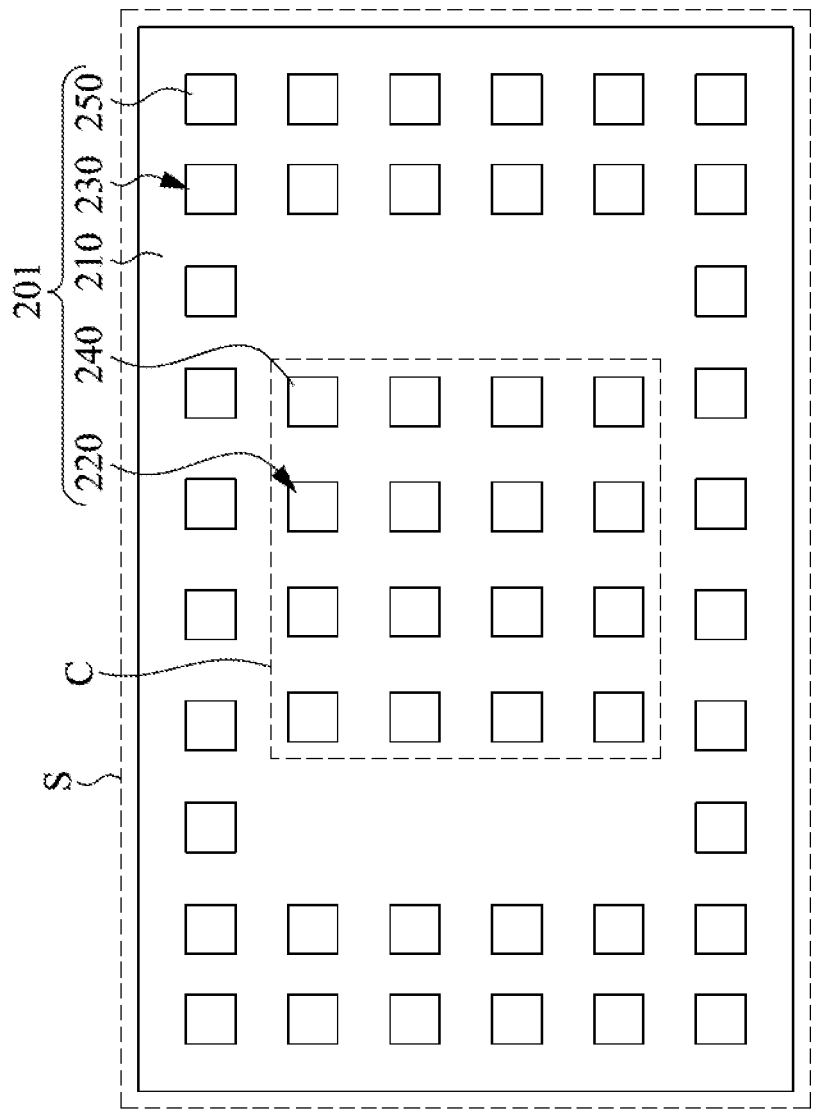
FIG. 5 is a top view of the circuit protection assembly of FIG. 3.

Reference is now made to FIG. 3 to FIG. 5, in which FIG. 3 is a schematic view of a probe card device 11 according to one embodiment of the present disclosure, FIG. 4 is an enlarged cross-sectional view of the circuit protection assembly 201 of FIG. 3, and FIG. 5 is a top view of the circuit protection assembly 201 of FIG. 3. As shown in FIG. 3 to FIG. 5, the probe card device 11 of the embodiment is substantially the same as the aforementioned probe card device 10, except that the wiring board 101 is further provided with a plurality of second contacts 130. The second contacts 130 are spaced formed on the surface of the substrate 110, and separably surround the first contacts 120. The first contacts 120 are used to transmit power or ground signals, and the second contacts 130 are used to transmit information signals. The probe head 301 further includes a plurality of second conductive probes 500 arranged on the probe holder 310, respectively, and the second conductive probes 500 surround the first conductive probes 400.

The first conductive probes 400 are used to contact with the power or ground leads of the DUT (not shown), and the second conductive probes 500 are used to contact with the signal leads of the DUT (not shown). The circuit protection assembly 201 further includes a plurality of second through holes 230 and a plurality of conductive metal elements 250. The second through holes 230 are respectively formed on the insulation plate 210, and surround the first through holes 220. The conductive metal elements 250 are respectively buried within the second through holes 230. Each of the conductive metal elements 250 is electrically connected to one of the second contacts 130 and one of the second conductive probes 500. For example, one end of each of the conductive metal elements 250 is soldered to one of the second contacts 130 through a solder ball B3, and the other end thereof is soldered to one of the second conductive probes 500 through a solder ball B4. More specifically, the corresponding conductive metal element 250 is connected to the second conductive probes 500 through the corresponding solder ball B4 and the connected board 800.

Furthermore, the connected board 800 further includes a plurality of third conductive pads 840, a plurality of fourth conductive pads 850 and a plurality of second conductive routes 860. The third conductive pads 840 are arranged on the surface of the connected board 800 facing away from the probe head 300, and collectively surround the first conductive pads 810. Each of the third conductive pads 840 is connected to one of the conductive metal elements 250 through a solder ball B4. The fourth conductive pads 850 are oppositely disposed on the third conductive pads 840, arranged on the other surface of the connected board 800 facing towards the probe head 300, and surround the third conductive pads 840. Each of the fourth conductive pads 850 is connected to one of the second conductive probes 500. The second conductive routes 860 are separably arranged in the connected board 800. Each of the second conductive routes 860 is electrically connected to one of the third conductive pads 840 and one of the fourth conductive pads 850. The gap G3 between any two neighboring ones of the third conductive pads 840 is greater than the gap G4 between any two neighboring ones of the fourth conductive pads 850.

The insulation plate 210 of the circuit protection assembly 201 is divided into a central area C and a surrounding area S surrounding the central area C. The above-mentioned first through holes 220 and the self-resetting fusing elements 240 are completely located in the central area C, and these self-resetting fusing elements 240 are respectively a power channel or a ground channel for transmitting the above-mentioned power or ground signals. The above-mentioned second through holes 230 and the conductive metal element 250 are completely located in the surrounding area S, and these conductive metal elements 250 are respectively signal channels for transmitting the above-mentioned information signals.

Also, the probe holder 310 includes an upper guide plate 311, a lower guide plate 312, a base body 313, a plurality of first position openings 314 and a plurality of second position openings 315. The upper guide plate 311 is connected to the circuit protection assembly 201. The lower guide plate 312 is opposite to the upper guide plate 311. The base body 313 is sandwiched between the upper guide plate 311 and the lower guide plate 312. The first position openings 314 are respectively arranged on the base body 313 in the aforementioned array for fixedly holding the first conductive probes 400, respectively. The second position openings 315 are respectively arranged on the base body 313 and surround the first position openings 314 for fixedly holding the second conductive probes 500, respectively.

It should be understood that the number of the self-resetting fusing elements 240 in each figure is only demonstration. For example, the number of the self-resetting fusing elements 240 can also be as much as thousands, or even tens of thousands. However, the disclosure is not limited to thereto.

Thus, through the construction of the embodiments above, the present disclosure is able to avoid the needle burning or needle melting phenomenon so as to reduce the possibilities of specific probe failure and improve the continuous electrical inspection.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A probe card device, used to test a device under test (DUT), the probe card device comprising:
   a wiring board provided with a plurality of first contacts and a plurality of second contacts;
   a probe head comprising a probe holder, a plurality of first conductive probes arranged on the probe holder, respectively and a plurality of second conductive probes arranged on the probe holder; and
   a circuit protection assembly comprising:
      an insulation plate sandwiched between the wiring board and the probe head, and provided with a first surface and a second surface opposite to each other;
      a plurality of first through holes respectively formed on the insulation plate, and arranged on the insulation plate in a first pattern array form;
      a plurality of second through holes respectively formed on the insulation plate and arranged on the insulation plate in a second pattern array form;
      a plurality of self-resetting fusing elements respectively disposed within the first through holes, each of the self-resetting fusing elements that is electrically connected to one of the first contacts and one of the first conductive probes for reversibly breaking down electric currents from the wiring board to the one of the first conductive probes, each of the self-resetting fusing elements comprising a first T-shaped solder pad, a second T-shaped solder pad and a resettable fuse portion that is totally buried within one of the first through holes, coaxially aligned with the first T-shaped solder pad and the second T-shaped solder pad and sandwiched between the first T-shaped solder pad and the second T-shaped solder pad, wherein one part of the first T-shaped solder pad is disposed on the first surface of the insulation plate facing towards the wiring board and directly contacted with one of the first contacts, and another part of the first T-shaped solder pad is extended into the one of the first through holes to be contacted with one end of the resettable fuse portion, and one part of the second T-shaped solder pad is disposed on the second surface of the insulation plate facing towards the probe head and electrically connected to one of the first conductive probes, and another part of the second T-shaped solder pad is extended into the one of the first through holes to be contacted with the other end of the resettable fuse portion; and a plurality of conductive metal elements different from the self-resetting fusing elements, and respectively buried within the second through holes, and each of the conductive metal elements that is electrically connected to one of the second contacts and one of the second conductive probes, wherein the wiring board, the circuit protection assembly and the probe head are sequentially stacked together as a stacked structure in a direction, and the first T-shaped solder pads are soldered to the first contacts with first solder balls, respectively, and the second T-shaped solder pads are soldered to the second contacts with second solder balls, respectively.

2. The probe card device of claim 1, wherein when a temperature of one of the self-resetting fusing elements rises to a critical value, the one of the self-resetting fusing elements is switched from a power-on state into a power-off state.

3. The probe card device of claim 2, wherein the critical value is between 150° C. and 200° C.

4. The probe card device of claim 1, wherein the resettable fuse portion is a polymeric positive temperature coefficient (PPTC) body.

5. The probe card device of claim 1, wherein the resettable fuse portion is a ceramics positive temperature coefficient (CPTC) body.

6. The probe card device of claim 1, wherein the second contacts surround the first contacts, the second conductive probes surround the first conductive probes, and the second through holes surround the first through holes.

7. The probe card device of claim 6, wherein the self-resetting fusing elements are respectively a power channel or a ground channel, and the conductive metal elements are respectively a signal channel.

8. The probe card device of claim 6, wherein the probe card device is a vertical probe card, and the first conductive probes and the second conductive probes are cobra probes, respectively.

9. The probe card device of claim 8, wherein the probe head comprises:

an upper guide plate connected to the circuit protection assembly;

a lower guide plate that is opposite to the upper guide plate;

a base body sandwiched between the upper guide plate and the lower guide plate;

a plurality of first position openings respectively arranged on the base body in an array for fixedly holding the first conductive probes, respectively; and a plurality of second position openings respectively arranged on the base body and surrounding the first position openings for fixedly holding the second conductive probes, respectively.

10. The probe card device of claim 1, further comprising:

a space transforming layer located between the probe head and the circuit protection assembly, and the space transforming layer comprising a plurality of first conductive pads, a plurality of second conductive pads and a plurality of conductive route, wherein the first conductive pads and the second conductive pads are respectively disposed on two opposite surfaces of the space transforming layer, the first conductive pads are electrically connected to the self-resetting fusing elements, respectively, the second conductive pads are electrically connected to the first conductive probes, respectively, the conductive route are separately arranged in the space transforming layer, and each of the conductive route is electrically connected to one of the first conductive pads and one of the second conductive pads, wherein a gap between any two neighboring ones of the first conductive pads is greater than a gap between any two neighboring ones of the second conductive pads.

11. A circuit protection assembly of a probe card device that is suitable to be directly sandwiched between a wiring board and a probe head of the probe card device, the circuit protection assembly, comprising:

an insulation plate having a first surface and a second surface opposite to each other;

a plurality of first through holes respectively formed on the insulation plate, and arranged on the insulation plate in a first pattern array form;

a plurality of second through holes respectively formed on the insulation plate and arranged on the insulation plate in a second pattern array form;

a plurality of self-resetting fusing elements respectively buried within the first through holes for reversibly breaking down electric currents from the wiring board to one conductive probe, each of the self-resetting fusing elements comprising a first T-shaped solder pad, a second T-shaped solder pad and a resettable fuse portion that is totally buried within one of the first through holes, coaxially aligned with the first T-shaped solder pad and the second T-shaped solder pad and sandwiched between the first T-shaped solder pad and the second T-shaped solder pad, wherein one part of the first T-shaped solder pad is disposed on the first surface of the insulation plate, and another part of the first T-shaped solder pad is extended into the one of the first through holes to be contacted with one end of the resettable fuse portion, one part of the second T-shaped solder pad is disposed on the second surface of the insulation plate, and another part of the second T-shaped solder pad is extended into the one of the first through holes to be contacted with the other end of the resettable fuse portion; and a plurality of conductive metal elements different from the self-resetting fusing elements, and respectively buried within the second through holes, and each of the conductive metal elements that is used to be electrically connected to the wiring board and another conductive probe of the probe head, wherein the self-resetting fusing elements collectively form the first pattern array on the insulation plate.

12. The circuit protection assembly of claim 11, wherein when a temperature of one of the self-resetting fusing elements rises to a critical value, the one of the self-resetting fusing elements is switched from a power-on state into a power-off state.

13. The circuit protection assembly of claim 12, wherein the critical value is between 150° C. and 200° C.

14. The circuit protection assembly of claim 11, wherein the first solder pad, the resettable fuse portion and the second solder pad are fully filled within the one of the first through holes.

15. The circuit protection assembly of claim 11, wherein the resettable fuse portion is a polymeric positive temperature coefficient (PPTC) body.

16. The circuit protection assembly of claim 11, wherein the resettable fuse portion is a ceramics positive temperature coefficient (CPTC) body.

17. The circuit protection assembly of claim 11, wherein the second through holes respectively surround the first through holes.

18. The circuit protection assembly of claim 17, wherein the self-resetting fusing elements are respectively a power channel or a ground channel, and the conductive metal elements are respectively a signal channel.

* * * * *